United States Patent
De Voeght et al.

(10) Patent No.: US 6,994,026 B2
(45) Date of Patent: Feb. 7, 2006

(54) PREPARATION OF A FLEXOGRAPHIC PRINTING PLATE

(75) Inventors: Frank De Voeght, Heist op den Berg (BE); Peter Slabbinck, Knokke-Heist (BE); Huub Van Aert, Pulderbos (BE)

(73) Assignee: AGFA-Gevaert, Mortsel (BE)

( * ) Notice: Subject to any disclaimer, the term of this patent is extended or adjusted under 35 U.S.C. 154(b) by 0 days.

(21) Appl. No.: 10/356,996

(22) Filed: Feb. 3, 2003

(65) Prior Publication Data

US 2003/0179251 A1    Sep. 25, 2003

Related U.S. Application Data

(60) Provisional application No. 60/368,116, filed on Mar. 27, 2002.

(30) Foreign Application Priority Data

Mar. 22, 2002    (EP) .................................. 02100288

(51) Int. Cl.
*B41C 1/00* (2006.01)
(52) U.S. Cl. ................. 101/401.1; 101/463.1; 101/467; 430/302; 428/32.3; 428/32.34
(58) Field of Classification Search ............ 101/401.1, 101/463.1, 465, 466, 467; 430/302, 308; 428/32.34, 32.3
See application file for complete search history.

(56) References Cited

U.S. PATENT DOCUMENTS

| | | | | | |
|---|---|---|---|---|---|
| 3,877,945 | A | * | 4/1975 | Rosenhahn et al. | 430/518 |
| 4,554,181 | A | * | 11/1985 | Cousin et al. | 428/32.3 |
| 4,806,506 | A | * | 2/1989 | Gibson, Jr. | 430/309 |
| 5,085,976 | A | * | 2/1992 | Gibson et al. | 430/306 |
| 5,165,973 | A | * | 11/1992 | Kojima et al. | 428/331 |
| 5,474,843 | A | * | 12/1995 | Lambert et al. | 428/32.24 |
| 5,709,971 | A | * | 1/1998 | Bowman et al. | 430/14 |
| 5,800,973 | A | * | 9/1998 | Anderson et al. | 430/537 |
| 5,856,066 | A | * | 1/1999 | Yoshida et al. | 430/309 |
| 6,354,209 | B1 | * | 3/2002 | Van Aert et al. | 101/466 |
| 2001/0024713 | A1 | * | 9/2001 | Quintens et al. | 428/195 |
| 2002/0192436 | A1 | * | 12/2002 | Voeght et al. | 428/195 |

FOREIGN PATENT DOCUMENTS

| | | |
|---|---|---|
| DE | 41 17 127 | 11/1992 |
| EP | 0 503 621 | 9/1992 |
| EP | 0 992 846 | 4/2000 |
| EP | 1 072 953 | 1/2001 |

* cited by examiner

*Primary Examiner*—Ren Yan
*Assistant Examiner*—Jill E. Culler
(74) *Attorney, Agent, or Firm*—Joseph T. Guy; Nexsen Pruet LLC

(57) ABSTRACT

A method for the preparation of a flexographic printing plate is disclosed. In this method an ink jet image is used as mask for the exposure of a flexo plate precursor. The ink jet recording material is composed of several layers and comprises a binder, a cationic mordant and a spacing agent in its top layer.

10 Claims, No Drawings

PREPARATION OF A FLEXOGRAPHIC PRINTING PLATE

This appl. claims benefit to Provisional No. 60/368,116, filed Mar. 27, 2002.

FIELD OF THE INVENTION

The present invention relates to a method for preparing a flexographic printing plate.

BACKGROUND OF THE INVENTION

Negative working flexographic printing plates typically comprise a base and a photopolymer layer which is cured by image-wise exposure to (UV) light. During a subsequent processing step, the unexposed areas are removed by a developing liquid and a relief plate is obtained wherein the printing areas are raised above the surrounding non-printing areas. In positive working plates the reverse occurs. The relief image distinguishes flexography from other printing techniques such as lithography (planographic process wherein printing and non-printing areas are part of the same surface) and gravure (printing areas are recessed below the level of the non-printing areas).

Image-wise exposure of a flexographic plate is generally obtained by flood exposure of the photopolymer layer through a contact mask which is typically a film negative that is transparent in printing areas and opaque in the non-printing areas.

This film negative is a reproduction of an original in the form of multiple screened dots and lines composed of developed silver, originating from an exposed and developed classical photographic material, such as a camera, recording or contact photographic material. However, these conventional photographic materials, which are based on silver halide chemistry, are complex materials, which are rather costly and demand a sophisticated technology to manufacture them. Moreover, they require wet processing steps involving several chemical solutions which is a drawback from an ecological point of view.

SUMMARY OF THE INVENTION

The present invention seeks to realize the following advantages: providing an alternative original (or mask, or master) for the exposure of a flexographic printing plate precursor (meaning an unexposed untreated flexo plate). This original is easily to prepare at a low investment, demands no complex machinery at the customer level, and does not require an unecologial processing.

The above-mentioned advantageous effects are realized by providing a method for the preparation of a flexographic printing plate involving the following steps, in order:

(1) preparing an ink jet recording material comprising (i) a transparent support having front and back sides, and (ii) at the front side a layer assemblage of at least two ink receiving layers, comprising a binder, a cationic mordant in at least one of these layers, and further a spacing agent in the top layer of said assemblage, (2) jetting information-wise, according to digitally stored data, droplets of an UV-absorbing ink onto the front side of said ink jet recording material by means of an ink jet printer, thus forming a screened printed ink jet image, (3) flood exposing by actinic light a flexographic printing plate precursor through a master consisting of the ink jet image obtained by steps (1) and (2), (4) developing the exposed flexographic printing plate precursor into a flexographic printing plate.

Further advantages and embodiments of the present invention will become apparent from the following description.

DETAILED DESCRIPTION OF THE INVENTION

Ink Receiving Layers

It is essential to the present invention that the ink jet recording medium comprises at least two ink receiving layers comprising a binder, a cationic mordant in at least one of these layers, and a spacing agent in the top layer. The ink receiving layers can be coated as a double layer pack, a triple layer pack or even a quadruple layer pack. The layers may be coated by any of the well-known coating techniques, such as dip coating, air knife coating, slide hopper coating, extrusion coating, and curtain coating. The different receiving layers may be coated in different passes.

The cationic mordant may be distributed over the different layers, or it can be solely present in one or two of the layers and absent in the others. In the latter case it is preferably present in one of the upper layers, e.g. in the third and/or the fourth layer, counting from the base.

The spacing agent can be present in more than one layer, but, anyway, it must be present in the top layer, in order to assure close contact with the flexographic printing plate precursor without the occurence of air inclusions or uneveness during the overall exposure step of the sandwich master/flexo plate precursor. The binder can be chosen from a list of compounds well-known in the art including hydroxyethyl cellulose; hydroxypropyl cellulose; hydroxyethylmethyl cellulose; hydroxypropyl methyl cellulose; hydroxybutylmethyl cellulose; methyl cellulose; sodium carboxymethyl cellulose; sodium carboxymethylhydroxyethyl cellulose; water soluble ethylhydroxyethyl cellulose; cellulose sulfate; polyvinyl alcohol; vinylalcohol copolymers; polyvinyl acetate; polyvinylacetal; polyvinyl pyrrolidone; polyacrylamide; acrylamide/acrylic acid copolymer; styrene/acrylic acid copolymer; ethylene-vinylacetate copolymer; vinylmethyl ether/maleic acid copolymer; poly(2-acrylamido-2-methyl propane sulfonic acid); poly(diethylene triamine-co-adipic acid); polyvinyl pyridine; polyvinyl imidazole; polyethylene oxide; polyurethane; melamine resins; gelatin; carrageenan; dextran; gum arabic; casein; pectin; albumin; starch; collagen derivatives; collodion and agar-agar.

Different layers can contain different binders but preferably one and the same binder is used for all the layers. A preferred binder for the practice of the present invention is polyvinyl alcohol (PVA). This PVA can be an unmodified, partially or almost completely hydrolized PVA, Commercially available unmodified PVA binders include e.g. MOWIOL, trade mark of Hoechst AG, POLYVIOL WX 48/20, trade mark of Wacker Co., or AIRVOL 230, trade mark of Air Products Co. On the other hand it can be a modified PVA, e.g. a cationic PVA such as GOHSEFIMER K-210, trade mark of Nippon Goshei Co., or a silanol modified PVA, such as POVAL R2105, POVAL R1130, and POVAL R3109 of Kuraray CO.

The PVA can be used as the sole binder or can be admixed with small amounts of other well-known hydrophilic binders such as mentioned above.

As already explained above, at least one of the ink receiving layers contains a cationic mordant.

An example of a useful cationic mordant is a cationic polyurethane, such as WITCOBOND 213, trade mark of Crompton Corp.

Other suitable cationic compounds are poly(diallyldialkylammonium chloride) compounds, e.g. a poly(diallyldimethylammonium chloride) or, in short, a poly(dadmac). These compounds are commercially available from several companies, e.g. Aldrich, Calgon, Clariant, BASF, EKA Chemicals, Nalco Italiana and Nippon Goshei.

Other useful cationic compounds include dadmac copolymers such as copolymers with acrylamide; dimethylamineepichlorohydrine copolymers, e.g. POLYFIX 700, trade name of Showa High Polymer Co.; other Polyfix grades which could be used are POLYFIX 601, POLYFIX 301, POLYFIX 301A, POLYFIX 250WS, and POLYFIX 3000 ; NEOFIX E-117, trade name of Nicca Chemical Co., a polyoxyalkylene polyamine dicyanodiamine ; REDIFLOC 4150, trade name of EKA Chemicals, a polyamine; MADAME (methacrylatedimethylaminoethyl=dimethylaminoethyl methacrylate) or MADQUAT (methacryloxyethyltrimethylammonium chloride) modified polymers, e.g. ROHAGIT KL280, ROHAGIT 210, ROHAGIT SL144, PLEX 4739L, PLEX 3073 from Röhm, DIAFLOC KP155 and other DIAFLOC products from Diafloc Co., and BMB 1305 and other BMB products from EKA chemicals; cationic epichlorohydrin adducts such as POLYCUP 171 and POLYCUP 172, trade names from Hercules Co.; from Cytec industries : CYPRO products, e.g. CYPRO 514/515/516, SUPERFLOC 507/521/567; cationic cellulose derivatives such as CELQUAT L-2OO , H-1OO, SC-240C, SC-230M, trade names of Starch & Chemical Co., and QUATRISOFT LM 200UCARE polymers JR125, JR400, LR400, JR30M, LR30M and UCARE polymer LK; fixing agents from Chukyo Europe: PALSET JK-512, PALSET JK512L, PALSET JK-182, PALSET JK-220, WSC-173, WSC-173L, PALSET JK-320, PALSET JK-320L and PALSET JK-350; polyethyleneimine and copolymers, e.g. LUPASOL, trade name of BASF AG; triethanolamine-titanium-chelate, e.g. TYZOR, trade name of Du Pont Co.; copolymers of vinylpyrrolidone such as VIVIPRINT 111, trade name of ISP, a methacrylamido propyl dimethylamine copolymer; with dimethylaminoethylmethacrylate such as COPOLYMER 845 and COPOLYMER 937, trade names of ISP; with vinylimidazole, e.g. LUVIQUAT CARE, LUVITEC 73W, LUVITEC VPI55 K18P, LUVITEC VP155 K72W, LUVIQUAT FC905, LUVIQUAT FC550, LUVIQUAT HM522, and SOKALAN HP56, all trade names of BASF AG; polyamidoamines, e.g. RETAMINOL and NADAVIN, trade marks of Bayer AG; and phosphonium compounds such as disclosed in EP 609930. Still other cationic compounds include cationic aluminum oxide, cationic boehmite, and poly(aluminumhydroxchloride) such as SYLOJET A200, trade name of Grace Co. Still further cationic polymers include polyvinylamines, e.g. PVAM-0595B from Esprit Co., and cationic modified acrylics, e.g. ACRIT RKW319SX, trade name of Tasei Chemical Industries, and RD134 from Goo Chemical.

The nature and concentration of the spacing agent present in the top layer of the ink receiving pack must be chosen so that the best compromise between full-area density and transparency of the non-printed areas is obtained. Classes of useful spacing agents include following:

amorphous or crystalline silica particles preferably having an average particle size between 0.1 and 15 µm;

polymethylmethacrylate beads or a derivative thereof such as copoly(methylmethacrylate-stearylmethacrylate 98%/2%), stabilized by poly(styrene-maleic acid, sodium salt);

copolymers of methacrylic acid with methyl- or ethylmethacrylate;

TOSPEARL siloxane particles, trade name of Toshiba Co.;

SEAHOSTAR polysiloxane—silica particles (e.g. type KE-P50), trade name of Nippon Shokubai Co.;

CHEMIPEARL, spherical polymeric particles, marketed by Misui Petrochemical Industries, Ltd.;

the spherical polymeric beads disclosed in U.S. Pat. No. 4,861,818;

the alkali-soluble beads of U.S. Pat. No. 4,906,560 and EP 584407;

the insoluble polymeric beads disclosed in EP 466982.

In a preferred embodiment the spacing agent is composed of silica particles having an average particle size between 0.1 and 15 µm. Different types of silica may be used, such as crystalline silica, amorphous silica, precipitated silica, gel silica and fumed silica. Preferred types of silica particles include SYLOID types, trade name from Grace Co., such as Syloid 72 which is a finely divided, highly porous, synthetic, amorphous silica gel of high purity, having an average particle size of 4.5–5.7 when measured by the Grace method. Other useful silica particles include GASIL and CROSFIELD HP200 type from Crosfield Chemie BV.

Apart from the ingredients essential to the invention the ink-receiving layers may contain still other types of substances. Preferably they contain one or more surfactants, which can be chosen from the numerous known classes of surfactants. Most suitable are cationic surfactants, including e.g. N-alkyl dimethyl ammonium chloride, palmityl trimethyl ammonium chloride, dodecyldimethylamine, tetradecyldimethylamine, ethoxylated alkyl guanidine-amine complex, oleamine hydroxypropyl bistrimonium chloride, oleyl imidazoline, stearyl imidazoline, cocamine acetate, palmitamine, dihydroxyethylcocamine, cocotrimonium chloride, alkyl polyglycolether ammonium sulphate, ethoxylated oleamine, lauryl pyridinium chloride, N-oleyl-1,3-diaminopropane, stearamidopropyl dimethylamine lactate, coconut fatty amide, oleyl hydroxyethyl imidazoline, isostearyl ethylimidonium ethosulphate, lauramidopropyl PEG-dimoniumchloride phosphate, palmityl trimethylammonium chloride, and cetyltrimethylammonium bromide.

The ink-receiving layers may contain some minor amounts of pigments to such extent that they do not affect disadvantageously the transparency of the global ink jet recording element.

The pigment may be chosen from organic material such as polystyrene, polymethylmethacrylate, silicones, urea-formaldehyde condensation polymers, polyesters and polyamides. In general however, it is an inorganic porous pigment, such as silica, talc, clay, koalin, diatomaceous earth, calcium carbonate, magnesium carbonate, aluminium hydroxide, aluminium oxide, titanium oxide, zinc oxide, barium sulfate, calcium sulfate, zinc sulfide, satin white, boehmite and pseudo-boehmite.

The layers may also comprise a plasticizer such as ethylene glycol, diethylene glycol, propylene glycol, polyethylene glycol, glycerol monomethylether, glycerol monochlorohydrin, ethylene carbonate, propylene carbonate, tetrachlorophthalic anhydride, tetrabromophthalicanhydride, urea phosphate, triphenylphosphate, glycerol-monostearate, propylene glycol monostearate, tetramethylene sulfone, n-methyl-2-pyrrolidone, n-vinyl-2-pyrrolidone.

The ink-receiving layer according to this invention may be crosslinked to provide such desired features as waterfastness and non-blocking characteristics. The crosslinking is also useful in providing abrasion resistance and resistance to the formation of fingerprints on the element as a result of handling. There are a vast number of known crosslinking agents—also known as hardening agents—that will function to crosslink film forming materials. Hardening agents can be used individually or in combination and in free or in blocked form. A great many hardeners, useful for the present invention, are known, including formaldehyde and free dialdehydes, such as succinaldehyde and glutaraldehyde, blocked dialdehydes, active esters, sulfonate esters, active halogen compounds, isocyanate or blocked isocyanates, polyfunctional isocyanates, melamine derivatives, s-triazines and diazines, epoxides, active olefins having two or more active bonds, carbodiimides, isoxazolium salts subsituted in the 3-position, esters of 2-alkoxy-N-carboxy-dihydroquinoline, N-carbamoylpyridinium salts, hardeners of mixed function, such as halogen-substituted aldehyde acids (e.g. mucochloric and mucobromic acids), onium substituted acroleins and vinyl sulfones and polymeric hardeners, such as dialdehyde starches and copoly(acroleinmethacrylic acid), and oxazoline functional polymers, e.g. EPOCROS WS-500, and EPOCROS K-1000 series. Another useful crosslinker, especially when the binder is PVA is boric acid.

Support and Optional Auxiliary Layers

Useful transparent supports for the ink jet recording element used in accordance with the present invention include polymeric supports such as cellulose acetate propionate or cellulose acetate butyrate, polyesters such as polyethylene terephthalate (PET) and polyethylene naphthalate, polyamides, polycarbonates, polyimides, polyolefins, poly(vinylacetals), polyethers and polysulfonamides. Other examples of useful high-quality polymeric supports for the present invention include opaque white polyesters and extrusion blends of polyethylene terephthalate and polypropylene. Polyester film supports, and especially polyethylene terephthalate (PET), are preferred because of their excellent properties of dimensional stability.

In a preferred embodiment the support is subbed on both sides with a so-called latex subbing layer. An essential ingredient of this latex subbing layer is an adhesion promoting latex. A preferred class of latex polymers for this purpose are vinylidene chloride-containing copolymers having carboxyl functional groups. Illustrative of such polymers are (1) copolymers of vinylidene chloride and an unsaturated carboxylic acid such as acrylic or methacrylic acid, (2) copolymers of vinylidene chloride and a half ester of an unsaturated carboxylic acid such as the monomethylester of itaconic acid, (3) terpolymers of vinylidene chloride, itaconic acid and an alkyl acrylate or methacrylate such as ethyl acrylate or methyl methacrylate, and (4) terpolymers of vinylidene chloride, acrylonitrile or methacrylonitrile and an unsaturated carboxylic acid such as acrylic acid or methacrylic acid. In a most preferred embodiment the latex polymer is co(vinylidene chloride-methyl acrylate-itaconic acid; 88%/10%/2%).

As a further preferred ingredient of the coating solution of the latex subbing layer colloidal silica may be added. A preferred compound is KIESELSOL 100F (trade-mark of Bayer AG), average particle size 25–30 nm. The ratio of the amount of latex to silica is preferably about 80/20.

Furthermore, on the front side of the PET support there is also preferably a so-called gelatin subbing layer present between the latex subbing layer and the ink-receiving layers. In a preferred embodiment this gelatin subbing layer contains a mixture of gelatin and colloidal silica. A preferred compound is again KIESELSOL 300F (trade-mark of Bayer AG).

In a further preferred embodiment the back side of the PET support further comprises, on top of the latex subbing layer, an outermost backing layer containing an electroconductive compound. A preferred electroconductive compound is a polythiophene/polyanion complex. A preferred polythiophene is poly(3,4-ethylenedioxythiophene); a preferred polyanion is poly(styrene sulphonate).

Preparation of the Flexographic Printing Plate

Original untreated flexographic plates (the "precursor" of the ready-to-print flexo plate) are commercially available from different sources, e.g.;

AFP flexo plate, trade mark of Asahi Co.;
NYLOFLEX plate, trade mark of BASF AG;
CYREL plate, trade mark of DuPont Co.;
FLEX-LIGHT plate, trade mark of Polyfibron Co.;
FLEXCEED plate, trade mark of Supratech Co.;
OKHA-FLEX plate, trade mark of Tokyo Okha Co.;
COSMOLIGHT plate, trade mark of Toyobo. Co.;

The principle of photopolymeric relief printing plates, such as flexo plates, is based on the UV-induced photopolymerization of olefinic unsaturated compounds. The relief is obtained ty washing out the unexposed parts. Relief printing plates are up to 1000-fold thicker than lithographic printing plates. The relief height by finished flexo plates ranges from about 0.7 mm to 3.0 mm. The layer assemblage of a flexo plate typically comprises a base, such as steel, aluminum or polyester, an adhesive layer, the photopolymerizable layer and a protective foil comprising a release layer such as a silicone layer. The photopolymerizable layer includes a polymeric binder, a vinyl monomer and a photoinitiator. The polymeric binder controls the physical properties such as elasticity, hardness, and resistance to solvents. Often the polymeric binder takes part in the UV-induced crosslinking reaction and together with the polymerizing monomers forms a three-dimensional network. Examples of polymeric binders include polyamides, partly saponified poly(vinyl acetate), polyacrylates, polyesters and polyurethanes. Especially useful binders are thermoplastic elastomers such as styrene-isoprene-styrene rubbers, or styrene-butadiene-styrene block copolymers, ethylene-propylene-diene rubbers and nitrile rubbers.

Other optional ingredients of the photopolymer layer include polymerization inhibitors, plasticizers, and dyes and pigments which accentuate the relief form.

The ink jet image, for use as master in the exposure of the flexo plate precursor, can be applied to the ink jet recording medium by any of the well-known ink jet printing techniques, such as continuous ink jet printing, or the drop-on-demand technique such as thermal ink jet printing and piezo ink jet printing.

In order to obtain high UV densities in full printed areas preferably inks are used containing an appropriate concentration of carbon black. Alternatively, a mixture of yellow, magenta and cyan dyes or pigments adding up to black may be used. In order to further enhance the obtainable UV density an additional UV-absorbing compound can be incorporated in the ink composition.

In the present invention the ink jet image functioning as master, and the original flexo plate are brought together in close contact in a so-called UV contact exposure unit under the application of vacuum. As to the UV source, the exposure proceeds, for example, with medium pressure mercury vapour lamps with or without electrodes, or pulsed xenon lamps. These ultraviolet sources usually are equipped with a cooling installation, an installation to remove the produced ozone and optionally a nitrogen inflow to exclude air from the surface of the product to be cured during radiation processing. An intensity of 40 to 240 W/cm in the 200–400 nm region is usually employed. An example of a commercially available ultraviolet medium-pressure electrodeless mercury vapour lamp is the model VPS/I600 curing system of Fusion UV systems Ltd., UK. A pulsed xenon flash lamp is commercially available from IST Strahlentechnik GmbH, Nürtingen, Germany. Using the Fusion model one has also the possibility to use metal halide doped Hg vapour or XeCl excimer lamps, each with its specific UV emission spectrum.

High energy ionizing radiation such as X-rays, gamma rays, beta rays and accelerated electrons can also be used, but UV exposure is preferred.

After exposure, the soluble non-exposed parts of the flexo plate are washed out. Traditionally non-polar organic solvents were used but in recent times efforts are made to develop flexo plates that can be washed out with water or aqueous solutions.

After drying, most flexo plates are still sticky and are preferably subjected to a posttreatment process. By overall exposure of the plate with UV-C light the surface of the relief is hardened and detackified, and then the flexo plate is ready for printing.

The present invention will now be illustrated by the following examples without however being limited thereto.

EXAMPLES

Composition of the Ink Jet Recording Material

The support was a transparent polyethylene terephthalate film bearing on its front side a latex subbing layer containing essentially as adhesive latex co(vinylidene chloride-methyl acrylate-itaconic acid; 88%/10%/2%), colloidal silica and surfactants, and a gelatin subbing layer containing essentially gelatin and colloidal silica. On its back side a similar latex subbing layer and an electroconductive layer were present. On its front side the subbed PET was coated with following layers:

layer 1:5 g/m$^2$ of polyvinyl alcohol MOWIOL 8/88 from Hoechst AG, 0.016 g/m$^2$ surfactant cetyltrimethylammonium bromide;

layer 2:5 g/m$^2$ of polyvinyl alcohol MOWIOL 8/88;

layer 3:0.75 g/m$^2$ of polyvinyl alcohol MOWIOL 8/88; 0.375 g/m$^2$ of cationic polyurethane WITCOBOND 213 from Crompton Co., and 0.10 g/m$^2$ of copoly (methylmethacrylate-stearylmethacrylate 98%/2%), stabilized by poly(styrene-maleic acid, sodium salt), and 0.0125 g/m$^2$ surfactant cetyltrimethylammonium bromide;

layer 4: 0.5 g/m$^2$ of polyvinyl alcohol MOWIOL 8/88, 0.45 g/m$^2$ of spacing agent SYLOID 72 from Grace Co., and 0.016 g/m$^2$ surfactant cetyltrimethylammonium bromide.

The comparative material fo use as mask for the exposure of flexoplates, was the conventional silver halide contact film AGFA CONTACT DCm.

Physical Properties

The surface topography of the ink jet recording film used in accordance with the present invention, and of the DCm film used as comparative were similar. This is illustrated by table 1 which summarizes the distribution of different peak heights measured with a Perth-o-meter (C5D with RTK50).

TABLE 1

| Peak height range: | 0–1 | 1–2 | 2–3 | 3–4 | 4–5 $\mu$m |
|---|---|---|---|---|---|
| No. distrib. for ink jet mat.: | 35.4 | 11.3 | 1.4 | 0.1 | 0 |
| No. distrib. For DCm: | 36.5 | 11.5 | 3.9 | 1.3 | 0.1 |

As a consequence both types of film performed equally concerning vacuum times and sticking properties against a variety of flexo sleeves.

Properties of Printed Images

The color separations on the comparative DCm film were made in the classical work flow by contacting the different separations, exposed on a recorder film, on the DCm film with an appropriate UV exposure. The color separations on the ink jet recorder film were made by printing a digitally stored image (after "ripping")directly on the ink jet recorder film. In these experiments the prints were made with a ROLAND FJ-500 ink jet printer, with a WASATCH 4.3 RIP, with settings: 1080×1080 dpi-S1080-round dot. Also two different types of dye based black commercial inks were used: EPSON T407 and MUTOH LDP9K000.

Table 2 illustrates the obtained Dmin (UV) and Dmax (UV) values for the comparative DCm film and for the ink jet recorder film used in accordance with the present invention.

TABLE 2

| Ink jet film: | Dmin: 0.07 | Dmax Epson: 3.70 | Dmax Mutoh: 2.70 |
|---|---|---|---|
| Dcm (comp.:) | Dmin: 0.11 | Dmax: >5.0 | | performance as mask for exposure of flexo

The three films (DCm, ink jet recorder film printed with Epson T407 ink, and the ink jet recorder film printed with MUTOH LDP9K000 ink) were exposed on CYREL 110F67 (from DuPont Co.) and OHKAFLEX EU394 flexoplates. Different test criteria have been used to evaluate the performance of the different films on the flexo plates. The results are summarized in table 3a and 3b.

TABLE 3a

| evaluation of DCm (comp.) | | |
|---|---|---|
| Test criteria | CYREL | OHKAFLEX |
| Fonts (Times new Roman) | | |
| Smallest reproducible pos. Font: | 6 pts (*) | 6 pts |
| Smallest reproducible neg. Font: | 6 pts | 6 pts |
| Line art | | |
| Thinnest reproducible pos. Font: | <1 pt | <1 pt |
| Thinnest reproducible neg. Font: | 1 pt | 1 pt |
| Screen ruling 60 lpi round dot | | |
| Smallest reproducible dot: | No tests | |
| Largest reproducible dot: | | |
| Screen ruling 25 lpi round dot | | |
| Smallest reproducible dot: | 2% | 1% |
| Largest reproducible dot: | 98% | 98% |

TABLE 3b evaluation of ink jet film (inv.)

| Test criteria | Ink jet film + Epson ink | | Ink jet film + Mutoh ink | |
|---|---|---|---|---|
| | Cyrel | Ohkaflex | Cyrel | Ohkaflex |
| Fonts (Times new Roman) | | | | |
| Smallest reprod. pos. Font: | 8 pts | 8 pts | 12 pts | 12 pts |
| Smallest reprod. neg. Font: | 6 pts | 6 pts | 6 pts | 6 pts |
| Line art | | | | |
| Thinnest reprod. pos. Font: | 1 pt | 1 pt | 2 pts | 2 pts |
| Thinnest reprod. neg. Font: | 1 pt | 1 pt | 1 pt | 1 pt |
| Screen ruling 60 lpi round dot | | | | |
| Smallest reprod. dot: | 4% | 4% | 8% | 8% |
| Largest reprod. dot: | 96% | 96% | 94% | 94% |
| Screen ruling 25 lpi round dot | | | | |
| Smallest reprod. dot: | 1% | 2% | No tests | |
| Largest reprod. dot: | 98% | 98% | | |

Conclusion: ink jet recorder film gives results similar to classical silver halide films and can be used as a cheap and ecological alternative for exposing flexoplates.

Having described in detail preferred embodiments of the current invention, it will now be apparent to those skilled in the art that numerous modifications can be made therein without departing from the scope of the invention as defined in the appending claims.

The invention is claimed is:

1. A method for the preparation of a flexographic printing plate involving the following steps, in order,:
  (1) preparing an ink jet recording material comprising (i) a transparent support having front and back sides, and (ii) at the front side a layer assemblage of at least two ink receiving layers, comprising a binder, a cationic mordant in at least one of these layers, and a spacing agent in the top layer of said assemblage,
  (2) jetting information-wise, according to digitally stored data, droplets of an UV-absorbing dye based ink onto the front side of said ink jet recording material by means of an ink jet printer, thus forming a screened printed ink jet image,
  (3) flood exposing by actinic light a flexographic printing plate precursor through a master consisting of the ink jet image obtained by steps (1) and (2),
  (4) developing the exposed flexographic printing plate precursor into a flexographic printing plate wherein said transparent support is a polyethylene terephthalate support carrying on its front side a latex subbing layer and a gelatin subbing layer, and on its back side a latex subbing layer and an electroconductive outer backing layer.

2. A method according to claim 1 wherein said spacing agent is silica having an average particle size between 0.1 and 15 μm.

3. A method according to claim 1 wherein said cationic mordant is cationic polyurethane latex.

4. A method according to claim 1 wherein said cationic mordant is poly(diallyldialkylammonium chloride).

5. A method according to claim 1 wherein said binder is polyvinyl alcohol.

6. A method according to claim 1 wherein said layer assemblage comprises four layers.

7. A method according to claim 1 wherein said electroconductive outer backing layer contains a polythiophene/polyanion complex.

8. A method according to claim 7 wherein said polythiophene is poly(3,4-ethylenedioxythiophene).

9. A method according to claim 1 wherein said UV absorbing dye based ink is an aqueous ink containing a mixture of colorants adding up to black.

10. A method according to claim 1 wherein said UV-absorbing dye based ink further contains an additional UV-absorber.

* * * * *